(12) United States Patent
Lin et al.

(10) Patent No.: US 10,298,176 B2
(45) Date of Patent: May 21, 2019

(54) MIXER

(71) Applicant: National Chi Nan University, Puli, Nantou (TW)

(72) Inventors: Yo-Sheng Lin, Nantou (TW); Ching-Hung Peng, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 151 days.

(21) Appl. No.: 15/451,024

(22) Filed: Mar. 6, 2017

(65) Prior Publication Data

US 2018/0097479 A1    Apr. 5, 2018

(30) Foreign Application Priority Data

Oct. 3, 2016 (TW) .............................. 105131862 A

(51) Int. Cl.
| | |
|---|---|
| *G06G 7/12* | (2006.01) |
| *H03D 7/12* | (2006.01) |
| *H03H 11/32* | (2006.01) |
| *H03D 7/14* | (2006.01) |
| *H01P 5/10* | (2006.01) |

(52) U.S. Cl.
CPC ........... *H03D 7/125* (2013.01); *H03D 7/1441* (2013.01); *H03H 11/32* (2013.01); *H01P 5/10* (2013.01); *H03D 2200/0019* (2013.01); *H03D 2200/0023* (2013.01)

(58) Field of Classification Search
CPC ................ H03D 7/125; H03D 7/1441; H03D 2200/0023; H03D 2200/0019; H03H 11/32; H01P 5/10
USPC ........................................................ 327/355
See application file for complete search history.

(56) References Cited

U.S. PATENT DOCUMENTS

| 2004/0013179 A1* | 1/2004 | Cheng ................. H04B 1/0003 375/219 |
| 2016/0315623 A1* | 10/2016 | Beghein ................. H03K 23/50 |

* cited by examiner

*Primary Examiner* — Metasebia T Retebo
(74) *Attorney, Agent, or Firm* — Merchant & Gould P.C.

(57) ABSTRACT

A mixer includes a transconductance circuit and a mixing circuit. The transconductance circuit includes a capacitor and first and second transconductance modules. The first transconductance module converts a single-ended to-be-shifted voltage signal at a first terminal of the capacitor into a first input current signal. The second transconductance module converts a voltage signal at a second terminal of the capacitor into a second input current signal that cooperates with the first input current signal to constitute a differential input current signal pair. The mixing circuit mixes the differential input current signal pair with a differential oscillatory voltage signal pair to generate a differential mixed voltage signal pair.

14 Claims, 9 Drawing Sheets

MIXER

CROSS-REFERENCE TO RELATED APPLICATION

This application claims priority of Taiwanese Patent Application No. 105131862, filed on Oct. 3, 2016.

FIELD

The disclosure relates to a mixer, and more particularly to a mixer that can achieve a low noise figure.

BACKGROUND

Referring to FIG. 1, a conventional down-conversion mixer includes a first single-ended to differential converting circuit 51, a second single-ended to differential converting circuit 52, a transconductance circuit 53, a mixing circuit 54 and an output unit 55. The first single-ended to differential converting circuit 51 converts a single-ended oscillatory voltage signal into a differential oscillatory voltage signal pair. The second single-ended to differential converting circuit 52 converts a single-ended input voltage signal of radio frequency into a differential input voltage signal pair. The transconductance circuit 53 converts the differential input voltage signal pair into a differential input current signal pair. The mixing circuit 54 mixes the differential input current signal pair with the differential oscillatory voltage signal pair to generate a differential mixed voltage signal pair of intermediate frequency. The output unit 55 amplifies and buffers the differential mixed voltage signal pair to generate a differential output voltage signal pair.

A noise figure (NF) of the conventional down-conversion mixer can be expressed by the following equation:

$$NF = 1 + (NF_{52} - 1) + \frac{NF_{53} - 1}{G_{52}} + \frac{NF_{54} - 1}{G_{52} \cdot G_{53}} + \frac{NF_{55} - 1}{G_{52} \cdot G_{53} \cdot G_{54}} \quad \text{Equation 1}$$
$$= NF_{52} + \frac{NF_{53} - 1}{G_{52}} + \frac{NF_{54} - 1}{G_{52} \cdot G_{53}} + \frac{NF_{55} - 1}{G_{52} \cdot G_{53} \cdot G_{54}},$$

where $NF_{52}$, $NF_{53}$, $NF_{54}$ and $NF_{55}$ respectively denote noise figures of the second single-ended to differential converting circuit 52, the transconductance circuit 53, the mixing circuit 54 and the output unit 55, $G_{52}$, $G_{53}$ and $G_{54}$ respectively denote power gains of the second single-ended to differential converting circuit 52, the transconductance circuit 53 and the mixing circuit 54, and $G_{32} < 1$.

The conventional down-conversion mixer occupies a relatively large area. Moreover, FIGS. 2, 3 and 4 respectively illustrate a conversion gain, the noise figure and isolation between input terminals of the conventional down-conversion mixer at which the single-ended oscillatory voltage signal and the single-ended input voltage signal are received, under a circumstance where the single-ended input voltage signal has a frequency within a range of 70 GHz to 100 GHz or within a range of 80 GHz to 100 GHz, and where the single-ended oscillatory voltage signal has a frequency lower than that of the single-ended input voltage signal by 0.1 GHz. It is known from FIGS. 2, 3 and 4 that, for the conventional down-conversion mixer, the conversion gain is relatively low, the noise figure is relatively high, and the isolation is relatively low.

SUMMARY

Therefore, an object of the disclosure is to provide a mixer that can alleviate at least one of the drawbacks of the prior art.

According to the disclosure, the mixer includes a transconductance circuit and a mixing circuit. The transconductance circuit includes a capacitor, a first transconductance module and a second transconductance module. The capacitor has a first terminal for receiving a single-ended to-be-shifted voltage signal, and a second terminal. The first transconductance module is coupled to the first terminal of the capacitor for receiving the single-ended to-be-shifted voltage signal thereat, and converts the single-ended to-be-shifted voltage signal into a first input current signal that is anti-phase with the single-ended to-be-shifted voltage signal. The second transconductance module is coupled to the second terminal of the capacitor for receiving a voltage signal thereat, and converts the voltage signal into a second input current signal that is in-phase with the single-ended to-be-shifted voltage signal and that cooperates with the first input current signal to constitute a differential input current signal pair. The mixing circuit is for receiving a differential oscillatory voltage signal pair, and is coupled to the first and second transconductance modules for receiving the differential input current signal pair therefrom. The mixing circuit mixes the differential input current signal pair with the differential oscillatory voltage signal pair to generate a differential mixed voltage signal pair.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 5:
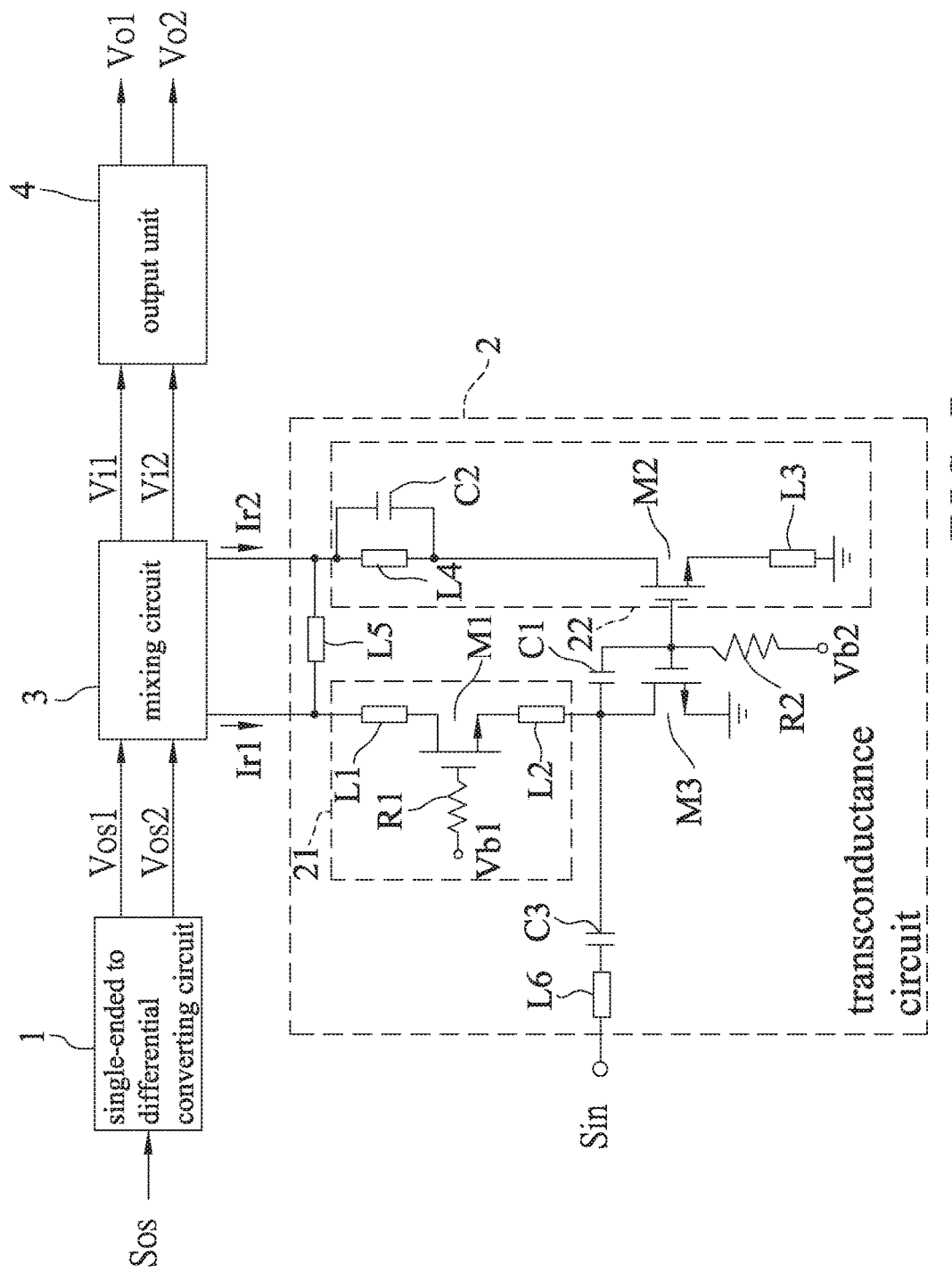
FIGS. 5 and 6 are circuit block diagrams illustrating an embodiment of a mixer according to the disclosure.

Referring to FIG. 5, an embodiment of a mixer according to the disclosure includes a single-ended to differential converting circuit 1, a transconductance circuit 2, a mixing circuit 3 and an output unit 4.

The single-ended to differential converting circuit 1 is for receiving a single-ended oscillatory voltage signal (Sos), and converts the single-ended oscillatory voltage signal (Sos) into a differential oscillatory voltage signal pair that includes a first oscillatory voltage signal (Vos1) and a second oscillatory voltage signal (Vos2).

The transconductance circuit 2 is for receiving a single-ended input voltage signal (Sin) of, for example, radio frequency, and converts the single-ended input voltage signal (Sin) into a differential input current signal pair that includes a first input current signal (Ir1) and a second input current signal (Ir2).

The mixing circuit 3 is coupled to the single-ended to differential converting circuit 1 and the transconductance circuit 2 for receiving the differential oscillatory voltage signal pair and the differential input current signal pair respectively therefrom. The mixing circuit 3 mixes the differential input current signal pair with the differential oscillatory voltage signal pair to generate a differential mixed voltage signal pair that includes a first mixed voltage signal (Vi1) and a second mixed voltage signal (Vi2) and that is of, for example, intermediate frequency.

The output unit 4 is coupled to the mixing circuit 3 for receiving the differential mixed voltage signal pair therefrom, and amplifies and buffers the differential mixed voltage signal pair to generate a differential output voltage signal pair that includes a first output voltage signal (Vo1) and a second output voltage signal (Vo2).

In an example where the single-ended input voltage signal (Sin) has a frequency of 94 GHz, and where the single-ended oscillatory voltage signal (Sos) has a frequency of 93.9 GHz, the differential output voltage signal pair has a frequency of 0.1 GHz.

In this embodiment, the transconductance circuit 2 includes two inductors (L5, L6), two capacitors (C1, C3), a resistor (R2), a transistor (M3), a first transconductance module 21 and a second transconductance module 22. The inductor (L6) has a first terminal that is for receiving the single-ended input voltage signal (Sin), and a second terminal. The inductor (L6) is used for determining an input impedance of the trans conductance circuit 2. The capacitor (C3) has a first terminal that is coupled to the second terminal of the inductor (L6), and a second terminal that provides a single-ended to-be-shifted voltage signal. The capacitor (C3) is used for alternating current (AC) coupling and direct current (DC) blocking. The capacitor (C1) has a first terminal that is coupled to the second terminal of the capacitor (C3) for receiving the single-ended to-be-shifted voltage signal therefrom, and a second terminal. The capacitor (C1) is used for AC coupling and DC blocking. The resistor (R2) has a first terminal that is for receiving a bias voltage (Vb2), and a second terminal that is coupled to the second terminal of the capacitor (C1). The resistor (R2) is used for DC biasing. The transistor (M3) has a first terminal that is coupled to the second terminal of the capacitor (C3), a second terminal that is grounded, and a control terminal that is coupled to the second terminal of the capacitor (C1). The first transconductance module 21 is coupled to the second terminal of the capacitor (C3) for receiving the single-ended to-be-shifted voltage signal therefrom, and is coupled further to the mixing circuit 3. The first transconductance module 21 converts the single-ended to-be-shifted voltage signal into the first input current signal (Ir1), which is anti-phase with the single-ended to-be-shifted voltage signal. The second transconductance module 22 is coupled to the second terminal of the capacitor (C1) for receiving a voltage signal thereat, and is coupled further to the mixing circuit 3. The second transconductance module 22 converts the voltage signal at the second terminal of the capacitor (C1) into the second input current signal (Ir2), which is in-phase with the single-ended to-be-shifted voltage signal. The inductor (L5) is coupled between a common node of the first transconductance module 21 and the mixing circuit 3 and a common node of the second transconductance module 22 and the mixing circuit 3, and resonates with parasitic capacitances of the first and second transconductance modules 21, 22 and the mixing circuit 3.

In this embodiment, the first transconductance module 21 includes a resistor (R1), a transistor (M1) and two inductors (L1, L2). The resistor (R1) has a first terminal that is for receiving a bias voltage (Vb1), and a second terminal. The transistor (M1) has a first terminal, a second terminal, and a control terminal that is coupled to the second terminal of the resistor (R1) for receiving the bias voltage (Vb1) through the resistor (R1). The inductor (L2) has a first terminal that is coupled to the second terminal of the transistor (M1), and a second terminal that is coupled to the second terminal of the capacitor (C3) for receiving the single-ended to-be-shifted voltage signal therefrom. The inductor (L1) has a first terminal that is coupled to the mixing circuit 3 and that provides the first input current signal (Ir1), and a second terminal that is coupled to the first terminal of the transistor (M1).

In this embodiment, the second transconductance module 22 includes a transistor (M2), two inductors (L3, L4) and a capacitor (C2). The transistor (M2) has a first terminal, a second terminal, and a control terminal that is coupled to the second terminal of the capacitor (C1) for receiving the voltage signal thereat. The inductor (L4) has a first terminal that is coupled to the mixing circuit 3 and that provides the second input current signal (Ir2), and a second terminal that is coupled to the first terminal of the transistor (M2). The capacitor (C2) is coupled to the inductor (L4) in parallel. The inductor (L3) is coupled between the second terminal of the transistor (M2) and ground.

Figure 6:
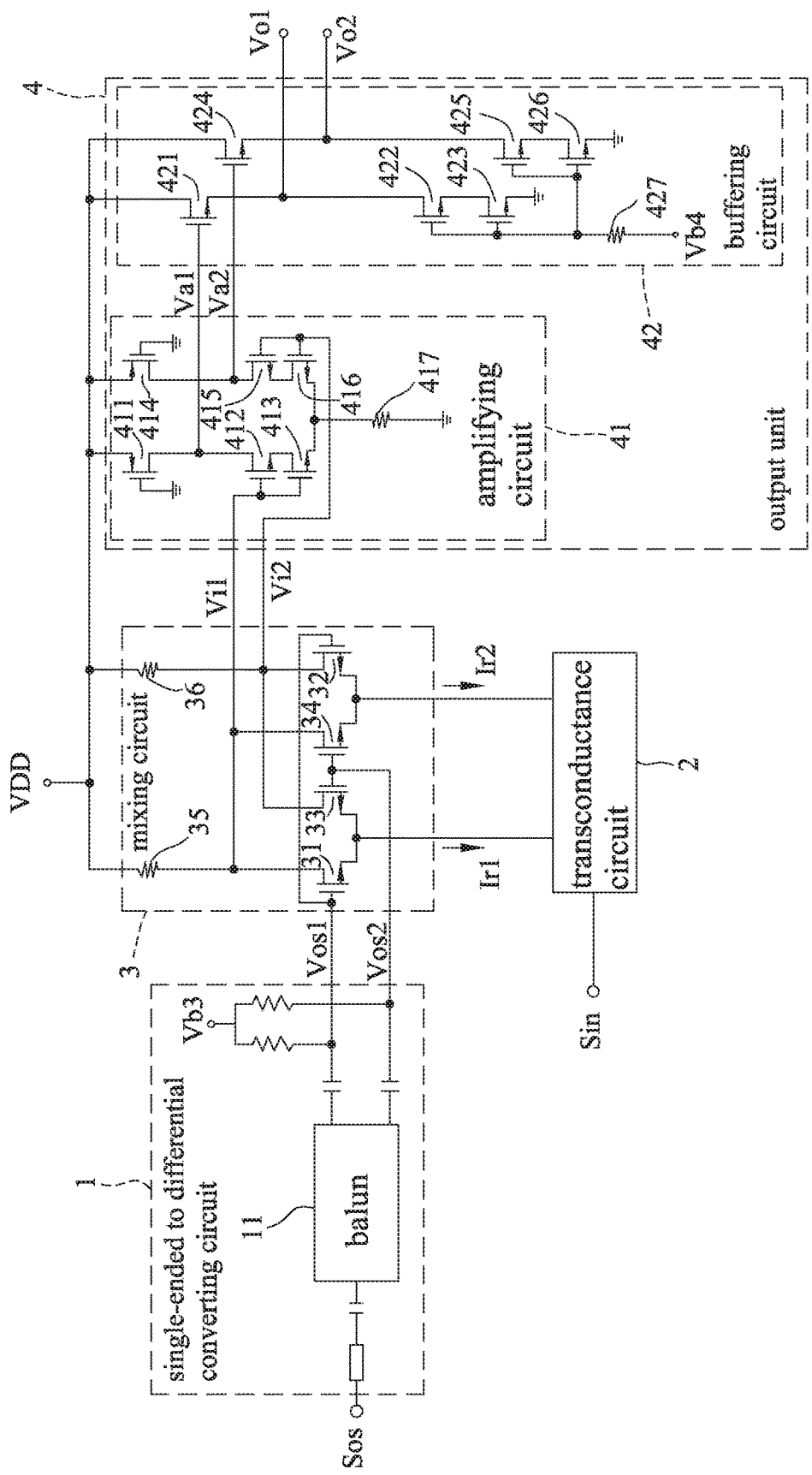

Referring to FIGS. 5 and 6, in this embodiment, the mixing circuit 3 includes four transistors 31-34 and two resistors 35, 36. The transistor 31 has a first terminal that provides the first mixed voltage signal (Vi1), a second terminal that is coupled to the first terminal of the inductor (L1), and a control terminal that is coupled to the single-ended to differential converting circuit 1 for receiving the first oscillatory voltage signal (Vos1) therefrom. The transistor 33 has a first terminal that provides the second mixed voltage signal (Vi2), a second terminal that is coupled to the second terminal of the transistor 31, and a control terminal that is coupled to the single-ended to differential converting circuit 1 for receiving the second oscillatory voltage signal (Vos2) therefrom. The transistor 33 cooperates with the transistor 31 to receive the first input current signal (Ir1). The transistor 34 has a first terminal that is coupled to the first terminal of the transistor 31, a second terminal that is coupled to the first terminal of the inductor (L4), and a control terminal that is coupled to the control terminal of the transistor 33. The transistor 32 has a first terminal that is coupled to the first terminal of the transistor 33, a second terminal that is coupled to the second terminal of the transistor 34, and a control terminal that is coupled to the control terminal of the transistor 31. The transistor 32 cooperates with the transistor 34 to receive the second input current signal (Ir2). The resistor 35 has a first terminal that is for receiving a supply voltage (VDD), and a second terminal that is coupled to the first terminal of the transistor 31. The resistor 36 is coupled between the first terminal of the resistor 35 and the first terminal of the transistor 33.

In this embodiment, the output unit 4 includes an amplifying circuit 41 and a buffering circuit 42. The amplifying circuit 41 is coupled to the mixing circuit 3 for receiving the differential mixed voltage signal pair therefrom, and amplifies the differential mixed voltage signal pair to generate a differential amplified voltage signal pair that includes a first amplified voltage signal (Va1) and a second amplified voltage signal (Va2). The buffering circuit 42 is coupled to the amplifying circuit 41 for receiving the differential amplified voltage signal pair therefrom, and buffers the differential amplified voltage signal pair to generate the differential output voltage signal pair.

In this embodiment, the amplifying circuit 41 includes six transistors 411-416 and a resistor 417. The transistor 412 has a first terminal that provides the first amplified voltage signal (Va1), a second terminal, and a control terminal that is coupled to the first terminal of the transistor 31 for receiving the first mixed voltage signal (Vi1) therefrom. The transistor 413 has a first terminal that is coupled to the second terminal of the transistor 412, a second terminal, and a control terminal that is coupled to the control terminal of the transistor 412. The transistor 415 has a first terminal that provides the second amplified voltage signal (Va2), a second terminal, and a control terminal that is coupled to the first terminal of the transistor 33 for receiving the second mixed voltage signal (Vi2) therefrom. The transistor 416 has a first terminal that is coupled to the second terminal of the transistor 415, a second terminal that is coupled to the second terminal of the transistor 413, and a control terminal that is coupled to the control terminal of the transistor 415. The transistor 411 has a first terminal that is for receiving the supply voltage (VDD), a second terminal that is coupled to the first terminal of the transistor 412, and a control terminal that is grounded. The transistor 414 has a first terminal that is coupled to the first terminal of the transistor 411, a second terminal that is coupled to the first terminal of the transistor 415, and a control terminal that is grounded. The resistor 417 is coupled between the second terminal of the transistor 413 and ground.

In this embodiment, the buffering circuit 42 includes six transistors 421-426 and a resistor 427. The transistor 421 has a first terminal that is for receiving the supply voltage (VDD), a second terminal that provides the first output voltage signal (Vo1), and a control terminal that is coupled to the first terminal of the transistor 412 for receiving the first amplified voltage signal (Va1) therefrom. The transistor 424 has a first terminal that is coupled to the first terminal of the transistor 421, a second terminal that provides the second output voltage signal (Vo2), and a control terminal that is coupled to the first terminal of the transistor 415 for receiving the second amplified voltage signal (Va2) therefrom. The resistor 427 has a first terminal that is for receiving a bias voltage (Vb4), and a second terminal. The transistor 422 has a first terminal that is coupled to the second terminal of the transistor 421, a second terminal, and a control terminal that is coupled to the second terminal of the resistor 427 for receiving the bias voltage (Vb4) through the resistor 427. The transistor 423 has a first terminal that is coupled to the second terminal of the transistor 422, a second terminal that is grounded, and a control terminal that is coupled to the control terminal of the transistor 422. The transistor 425 has a first terminal that is coupled to the second terminal of the transistor 424, a second terminal, and a control terminal that is coupled to the control terminal of the transistor 422. The transistor 426 has a first terminal that is coupled to the second terminal of the transistor 425, a second terminal that is grounded, and a control terminal that is coupled to the control terminal of the transistor 422.

In this embodiment, each of the transistors (M1-M3, 31-34, 412, 413, 415, 416, 421-426) is an N-type metal oxide semiconductor field effect transistor (nMOSFET) having a drain terminal, a source terminal and a gate terminal that respectively serve as the first, second and control terminals of the transistor; and each of the transistors (411, 414) is a P-type metal oxide semiconductor field effect transistor (pMOSFET) having a source terminal, a drain terminal and a gate terminal that respectively serve as the first, second and control terminals of the transistor. Therefore, the first transconductance module 21 has a common-gate configuration, and the second transconductance module 22 has a common-source configuration. Moreover, each of the inductors (L1-L6) is a transmission line inductor.

In this embodiment, the inductor (L5) resonates with the parasitic capacitances of the transistors (M1-M3, 31-34) to compensate a frequency pole generated due to the parasitic capacitances of the transistors (M1-M3, 31-34), thereby increasing a conversion gain of a combination of the transconductance circuit 2 and the mixing circuit 3, and thus increasing a conversion gain of the mixer. Moreover, resonance of the inductor (L5) and the parasitic capacitances of the transistors (M1-M3, 31-34) can prevent AC coupling across each of the parasitic capacitances of the transistors (M1-M3, 31-34), especially the AC coupling across the parasitic capacitance provided between the first and control terminals of the transistor (M2), thereby increasing isolation between input terminals of the mixer, at which the single-ended oscillatory voltage signal (Sos) and the single-ended input voltage signal (Sin) are received.

In this embodiment, the conversion gain (CG) of the combination of the transconductance circuit 2 and the mixing circuit 3 can be expressed by the following equation:

$$CG \approx \frac{4}{\pi} \cdot g_{m1,3} \cdot R_{34,36}, \quad \text{Equation 2}$$

where $g_{m1,3}$ denotes a transconductance of each of the transistors (M1, M3), and $R_{35,36}$ denotes a resistance of each of the resistors (35, 36).

Figure 1:
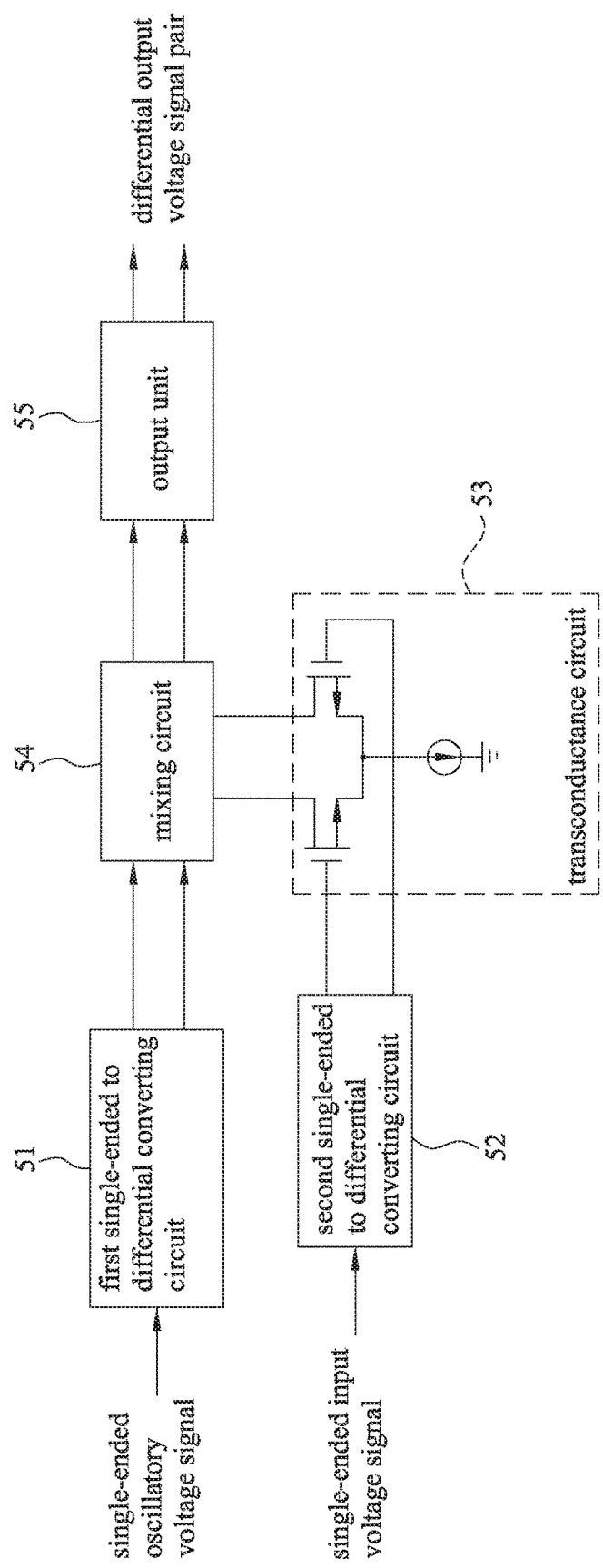
FIG. 1 is a circuit block diagram illustrating a conventional down-conversion mixer.

In this embodiment, a noise figure (NF) of the mixer can be expressed by the following equation:

$$NF = 1 + (NF_2 - 1) + \frac{NF_3 - 1}{G_2} + \frac{NF_4 - 1}{G_2 \cdot G_3} \quad \text{Equation 3}$$
$$= NF_2 + \frac{NF_3 - 1}{G_2} + \frac{NF_4 - 1}{G_2 \cdot G_3},$$

where $NF_2$, $NF_3$ and $NF_4$ respectively denote noise figures of the transconductance circuit 2, the mixing circuit 3 and the output unit 4, $G_2$ and $G_3$ respectively denote power gains of the transconductance circuit 2 and the mixing circuit 3, and $G_2$ may be greater than one. It is known from Equations 1 and 3 that, since the second single-ended to differential converting circuit 52 (see FIG. 1) with the power gain which is less than one is not required in the mixer of this embodiment, the noise figure of the mixer of this embodiment may be lower than that of the conventional down-conversion mixer.

In this embodiment, the single-ended to differential converting circuit 1 includes a balun 11 (e.g., a Marchand balun)

and other elements. The balun 11 has an input terminal that is for receiving a voltage signal associated with the single-ended oscillatory voltage signal (Sos), a first output terminal that provides a voltage signal associated with the first oscillatory voltage signal (Vos1), and a second output terminal that provides a voltage signal associated with the second oscillatory voltage signal (Vos2).

Figure 7:
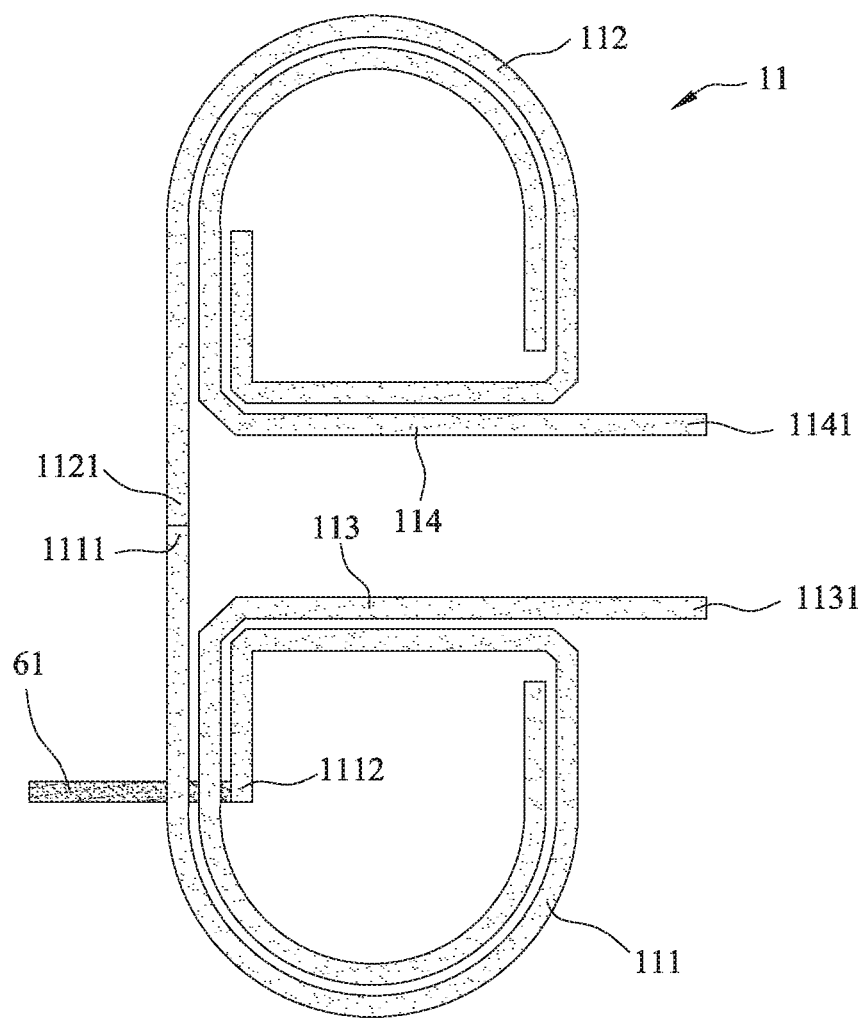
FIG. 7 is a layout diagram illustrating a first implementation of a balun of the embodiment.

Referring to FIG. 7, a first implementation of the balun 11 includes a first transmission line 111, a second transmission line 112, a third transmission line 113 and a fourth transmission line 114 that are formed in a top metal layer of a semiconductor process (e.g., metal 9 of a 90 nm complementary metal oxide semiconductor (CMOS) process). The first and third transmission lines 111, 113 are configured as interwound semi-circular spirals. The second and fourth transmission lines 112, 114 are configured as interwound semi-circular spirals. The first transmission line 111 has an outer terminal 1111, and an inner terminal 1112 that serves as the input terminal of the balun 11 and that may be coupled to another element (not shown) through a trace 61 which is formed in an underneath metal layer of the semiconductor process (e.g., metal 8 of the 90 nm CMOS process). The second transmission line 112 has an outer terminal 1121 that is directly coupled to the outer terminal 1111 of the first transmission line 111. The third transmission line 113 has an outer terminal 1131 that serves as the first output terminal of the balun 11. The fourth transmission line 114 has an outer terminal 1141 that serves as the second output terminal of the balun 11.

Figure 8:
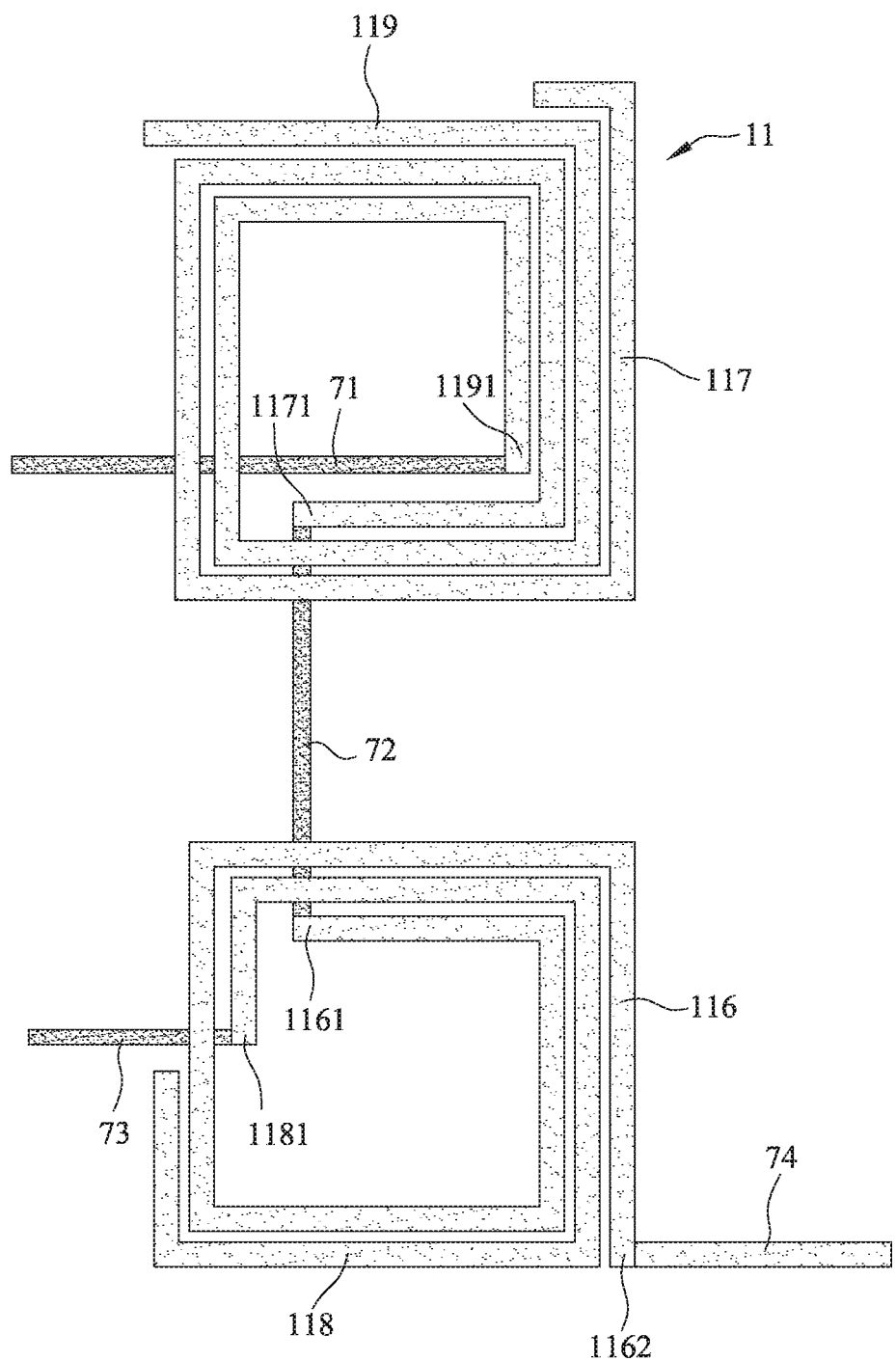
FIG. 8 is a layout diagram illustrating a second implementation of the balun of the embodiment.

Referring to FIG. 8, a second implementation of the balun 11 includes a first transmission line 116, a second transmission line 117, a third transmission line 118 and a fourth transmission line 119 that are formed in the top metal layer of the semiconductor process. The first and third transmission lines 116, 118 are configured as interwound rectangular spirals. The second and fourth transmission lines 117, 119 are configured as interwound rectangular spirals. The first transmission line 116 has an inner terminal 1161, and an outer terminal 1162 that serves as the input terminal of the balun 11 and that may be coupled to another element (not shown) through a trace 74 which is formed in the top metal layer of the semiconductor process. The second transmission line 117 has an inner terminal 1171 that is coupled to the inner terminal 1161 of the first transmission line 116 through a trace 72 which is formed in the underneath metal layer of the semiconductor process. The third transmission line 118 has an inner terminal 1181 that serves as the first output terminal of the balun 11, and that may be coupled to another element (not shown) through a trace 73 which is formed in the underneath metal layer of the semiconductor process. The fourth transmission line 119 has an inner terminal 1191 that serves as the second output terminal of the balun 11, and that may be coupled to another element (not shown) through a trace 71 which is formed in the underneath metal layer of the semiconductor process.

Referring to FIGS. 7 and 8, the underneath metal layer has a thickness (e.g., 0.85 μm for the metal 8 of the 90 nm CMOS process) smaller than that of the top metal layer (e.g., 3.4 μm for the metal 9 of the 90 nm CMOS process), and therefore each of the traces 61, 71-73 formed in the underneath metal layer causes relatively high power loss. Moreover, each right-angle configuration in the balun 11 causes relatively high power loss. In comparison, the first implementation of the balun 11 with one trace 61 and fewer right-angle configurations has lower power loss than the second implementation of the balun 11 with three traces 71-73 and more right-angle configurations.

Figure 2:
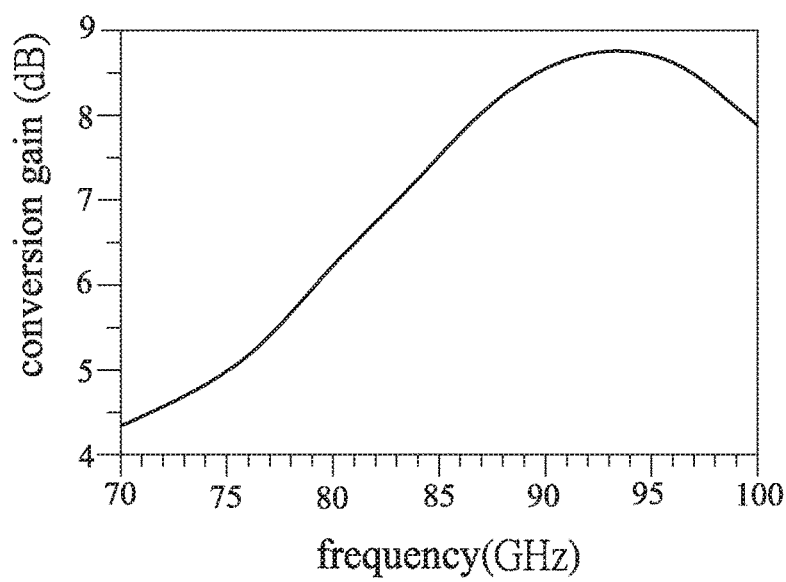
FIG. 2 is a plot illustrating simulated conversion gain versus frequency characteristic of the conventional down-conversion mixer.
Figure 9:
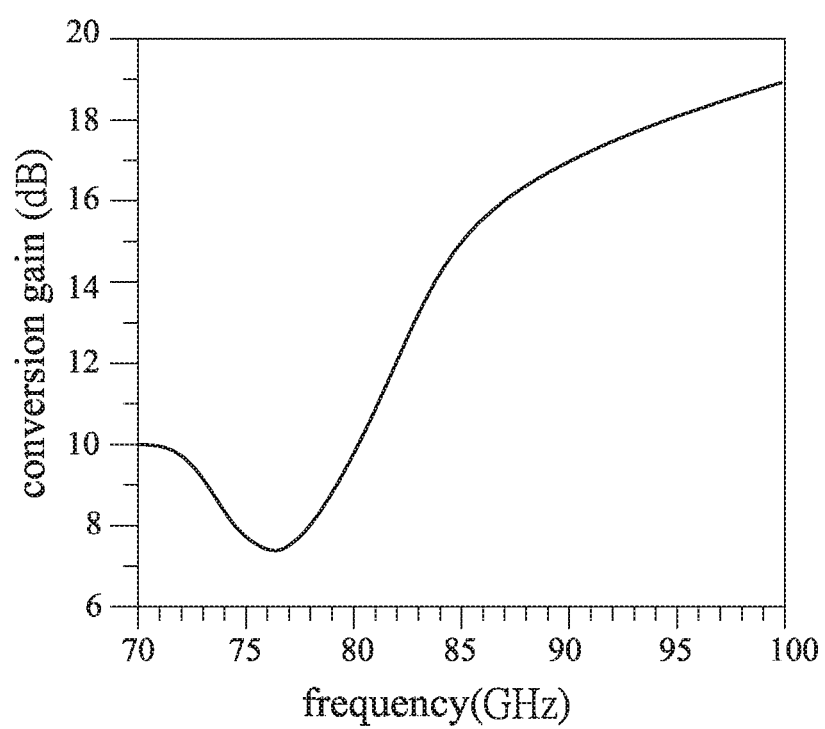
FIG. 9 is a plot illustrating simulated conversion gain versus frequency characteristic of the embodiment.

FIG. 9 illustrates the simulated conversion gain of the mixer of this embodiment under a circumstance where the frequency of the single-ended input voltage signal (Sin) (see FIG. 5) is within a range of 70 GHz to 100 GHz, and where the frequency of the single-ended oscillatory voltage signal (Sos) (see FIG. 5) is lower than that of the single-ended input voltage signal (Sin) by 0.1 GHz. It is known from FIGS. 2 and 9 that the conversion gain of the mixer of this embodiment is higher than that of the conventional down-conversion mixer.

Figure 3:
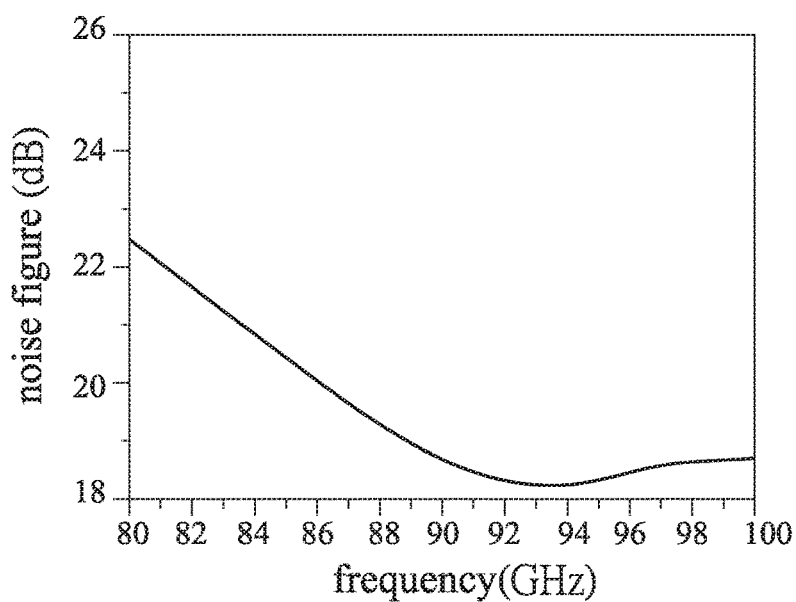
FIG. 3 is a plot illustrating simulated noise figure versus frequency characteristic of the conventional down-conversion mixer.
Figure 10:
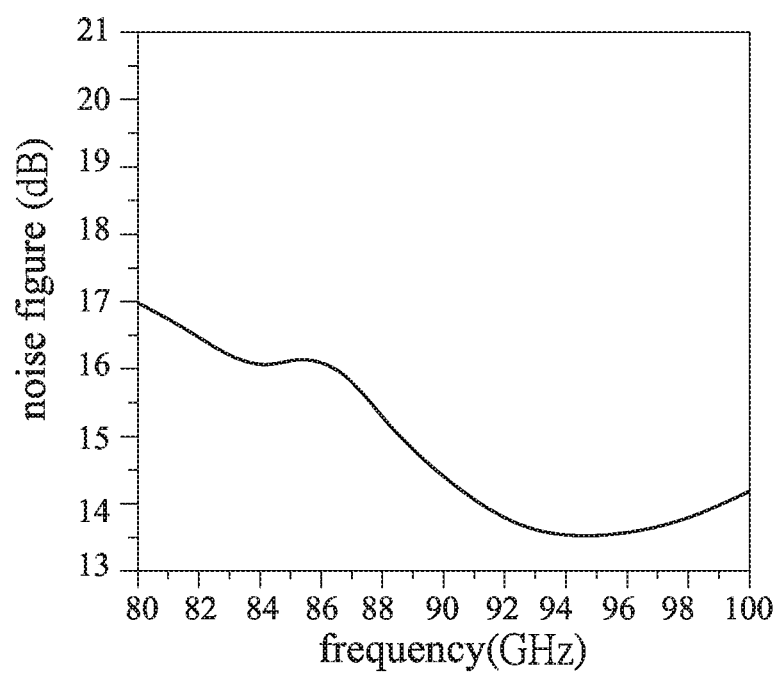
FIG. 10 is a plot illustrating simulated noise figure versus frequency characteristic of the embodiment.

FIG. 10 illustrates the simulated noise figure of the mixer of this embodiment under a circumstance where the frequency of the single-ended input voltage signal (Sin) (see FIG. 5) is within a range of 80 GHz to 100 GHz, and where the frequency of the single-ended oscillatory voltage signal (Sos) (see FIG. 5) is lower than that of the single-ended input voltage signal (Sin) by 0.1 GHz. It is known from FIGS. 3 and 10 that the noise figure of the mixer of this embodiment is lower than that of the conventional down-conversion mixer.

Figure 4:
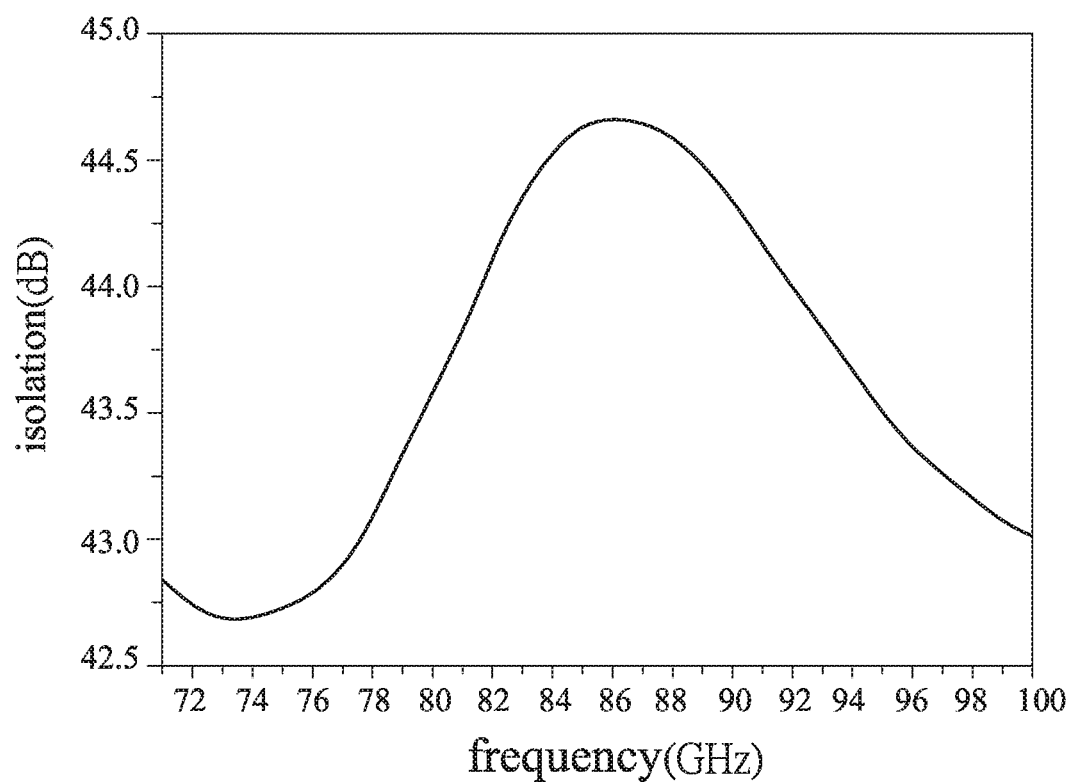
FIG. 4 is a plot illustrating simulated isolation versus frequency characteristic of the conventional down-conversion mixer.
Figure 11:
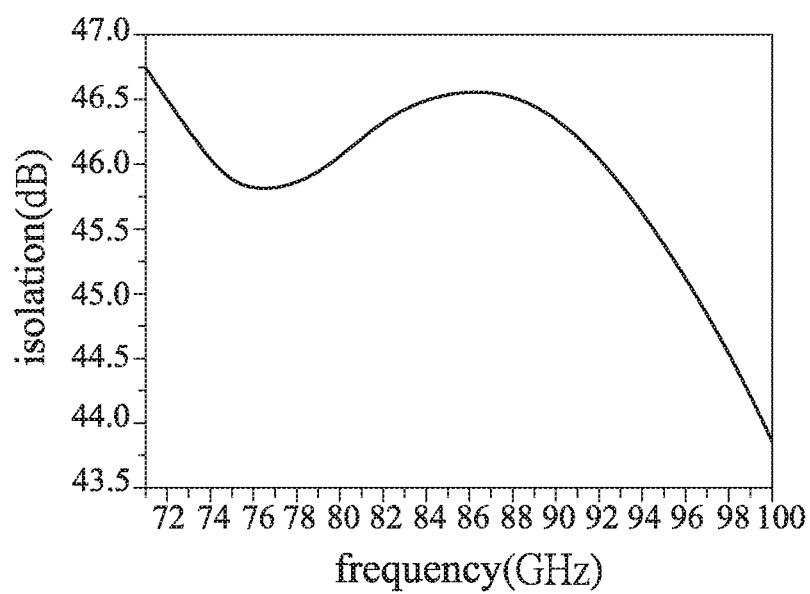
FIG. 11 is a plot illustrating simulated isolation versus frequency characteristic of the embodiment.

FIG. 11 illustrates the simulated isolation between the input terminals of the mixer of this embodiment under a circumstance where the frequency of the single-ended input voltage signal (Sin) (see FIG. 5) is within a range of 70 GHz to 100 GHz, and where the frequency of the single-ended oscillatory voltage signal (Sos) (see FIG. 5) is lower than that of the single-ended input voltage signal (Sin) by 0.1 GHz. It is known from FIGS. 4 and 11 that the isolation of the mixer of this embodiment is higher than that of the conventional down-conversion mixer.

Referring to FIG. 5, in view of the above, the mixer of this embodiment has the following advantages:

1. By virtue of the transconductance circuit 2 that converts the single-ended input voltage signal (Sin) into the differential input current signal pair, the second single-ended to differential converting circuit 52 (see FIG. 1) with the power gain which is less than one is not required in the mixer of this embodiment. Therefore, an area occupied by the mixer and the noise figure of the mixer can be reduced, and a power gain of the mixer can be increased.

2. By virtue of the inductor (L5) that resonates with the parasitic capacitances of the transistors (M1-M3, 31-34), the conversion gain of the combination of the transconductance circuit 2 and the mixing circuit 3 can be increased, thereby increasing the conversion gain of the mixer and reducing the noise figure of the mixer.

3. By virtue of the inductor (L5) that resonates with the parasitic capacitances of the transistors (M1-M3, 31-34), the isolation between the input terminals of the mixer can be increased.

4. By virtue of the balun 11 of the first implementation, the power loss of the mixer can be reduced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A mixer comprising:
a transconductance circuit including
a first capacitor having a first terminal for receiving a single-ended to-be-shifted voltage signal, and a second terminal,
a first transconductance module coupled to said first terminal of said first capacitor for receiving the single-ended to-be-shifted voltage signal thereat, and converting the single-ended to-be-shifted voltage signal into a first input current signal that is anti-phase with the single-ended to-be-shifted voltage signal, and
a second transconductance module coupled to said second terminal of said first capacitor for receiving a voltage signal thereat, and converting the voltage signal into a second input current signal that is in-phase with the single-ended to-be-shifted voltage signal and that cooperates with the first input current signal to constitute a differential input current signal pair; and
a mixing circuit for receiving a differential oscillatory voltage signal pair, and coupled to said first and second transconductance modules for receiving the differential input current signal pair therefrom, said mixing circuit mixing the differential input current signal pair with the differential oscillatory voltage signal pair to generate a differential mixed voltage signal pair;
wherein said first transconductance module includes
a first transistor having a first terminal, a second terminal, and a control terminal that is for receiving a bias voltage;
a first inductor having a first terminal that is coupled to said second terminal of said first transistor, and a second terminal that is coupled to said first terminal of said first capacitor for receiving the single-ended to-be-shifted voltage signal thereat; and
a second inductor having a first terminal that is coupled to said mixing circuit and that provides the first input current signal, and a second terminal that is coupled to said first terminal of said first transistor.

2. The mixer of claim 1, wherein said transconductance circuit further includes a second transistor having a first terminal that is coupled to said first terminal of said first capacitor, a second terminal that is grounded, and a control terminal that is coupled to said second terminal of said first capacitor.

3. The mixer of claim 2, wherein said transconductance circuit further includes:
a third inductor having a first terminal that is for receiving a single-ended input voltage signal, and a second terminal; and
a second capacitor having a first terminal that is coupled to said second terminal of said third inductor, and a second terminal that is coupled to said first terminal of said first capacitor and that provides the single-ended to-be-shifted voltage signal.

4. The mixer of claim 1, wherein said second transconductance module includes:

a second transistor having a first terminal, a second terminal, and a control terminal that is coupled to said second terminal of said first capacitor for receiving the voltage signal thereat;
a third inductor having a first terminal that is coupled to said mixing circuit and that provides the second input current signal, and a second terminal that is coupled to said first terminal of said second transistor;
a second capacitor coupled to said third inductor in parallel; and
a fourth inductor coupled between said second terminal of said second transistor and ground.

5. The mixer of claim 1, wherein said transconductance circuit further includes a third inductor that is coupled between a common node of said first transconductance module and said mixing circuit and a common node of said second transconductance module and said mixing circuit, and that resonates with parasitic capacitances of said first and second transconductance modules and said mixing circuit.

6. The mixer of claim 1, wherein the differential oscillatory voltage signal pair includes a first oscillatory voltage signal and a second oscillatory voltage signal, the differential mixed voltage signal pair includes a first mixed voltage signal and a second mixed voltage signal, and said mixing circuit includes:
a second transistor having a first terminal that provides the first mixed voltage signal, a second terminal that is coupled to said first transconductance module, and a control terminal that is for receiving the first oscillatory voltage signal;
a third transistor having a first terminal that provides the second mixed voltage signal, a second terminal that is coupled to said second terminal of said second transistor, and a control terminal that is for receiving the second oscillatory voltage signal, said third transistor cooperating with said second transistor to receive the first input current signal;
a fourth transistor having a first terminal that is coupled to said first terminal of said second transistor, a second terminal that is coupled to said second transconductance module, and a control terminal that is coupled to said control terminal of said third transistor;
a fifth transistor having a first terminal that is coupled to said first terminal of said third transistor, a second terminal that is coupled to said second terminal of said fourth transistor, and a control terminal that is coupled to said control terminal of said second transistor, said fifth transistor cooperating with said fourth transistor to receive the second input current signal;
a first resistor having a first terminal that is for receiving a supply voltage, and a second terminal that is coupled to said first terminal of said second transistor; and
a second resistor coupled between said first terminal of said first resistor and said first terminal of said third transistor.

7. The mixer of claim 1, further comprising an amplifying circuit that is coupled to said mixing circuit for receiving the differential mixed voltage signal pair therefrom, and that amplifies the differential mixed voltage signal pair to generate a differential amplified voltage signal pair.

8. The mixer of claim 7, wherein the differential mixed voltage signal pair includes a first mixed voltage signal and a second mixed voltage signal, the differential amplified voltage signal pair includes a first amplified voltage signal and a second amplified voltage signal, and said amplifying circuit includes:

a second transistor having a first terminal that provides the first amplified voltage signal, a second terminal, and a control terminal that is coupled to said mixing circuit for receiving the first mixed voltage signal therefrom;

a third transistor having a first terminal that is coupled to said second terminal of said second transistor, a second terminal, and a control terminal that is coupled to said control terminal of said second transistor;

a fourth transistor having a first terminal that provides the second amplified voltage signal, a second terminal, and a control terminal that is coupled to said mixing circuit for receiving the second mixed voltage signal therefrom;

a fifth transistor having a first terminal that is coupled to said second terminal of said fourth transistor, a second terminal that is coupled to said second terminal of said third transistor, and a control terminal that is coupled to said control terminal of said fourth transistor;

a sixth transistor having a first terminal that is for receiving a supply voltage, a second terminal that is coupled to said first terminal of said second transistor, and a control terminal that is grounded;

a seventh transistor having a first terminal that is coupled to said first terminal of said sixth transistor, a second terminal that is coupled to said first terminal of said fourth transistor, and a control terminal that is grounded; and a resistor coupled between said second terminal of said third transistor and ground.

9. The mixer of claim 7, further comprising a buffering circuit that is coupled to said amplifying circuit for receiving the differential amplified voltage signal pair therefrom, and that buffers the differential amplified voltage signal pair to generate a differential output voltage signal pair.

10. The mixer of claim 9, wherein the differential amplified voltage signal pair includes a first amplified voltage signal and a second amplified voltage signal, the differential output voltage signal pair includes a first output voltage signal and a second output voltage signal, and said buffering circuit includes:

a second transistor having a first terminal that is for receiving a supply voltage, a second terminal that provides the first output voltage signal, and a control terminal that is coupled to said amplifying circuit for receiving the first amplified voltage signal therefrom;

a third transistor having a first terminal that is coupled to said first terminal of said second transistor, a second terminal that provides the second output voltage signal, and a control terminal that is coupled to said amplifying circuit for receiving the second amplified voltage signal therefrom;

a fourth transistor having a first terminal that is coupled to said second terminal of said second transistor, a second terminal, and a control terminal that is for receiving a bias voltage;

a fifth transistor having a first terminal that is coupled to said second terminal of said fourth transistor, a second terminal that is grounded, and a control terminal that is coupled to said control terminal of said fourth transistor;

a sixth transistor having a first terminal that is coupled to said second terminal of said third transistor, a second terminal, and a control terminal that is coupled to said control terminal of said fourth transistor; and a seventh transistor having a first terminal that is coupled to said second terminal of said sixth transistor, a second terminal that is grounded, and a control terminal that is coupled to said control terminal of said fourth transistor.

11. A mixer comprising:

a transconductance circuit including
a first capacitor having a first terminal for receiving a single-ended to-be-shifted voltage signal, and a second terminal, a first transconductance module coupled to said first terminal of said first capacitor for receiving the single-ended to-be-shifted voltage signal thereat, and converting the single-ended to-be-shifted voltage signal into a first input current signal that is anti-phase with the single-ended to-be-shifted voltage signal, and a second transconductance module coupled to said second terminal of said first capacitor for receiving a voltage signal thereat, and converting the voltage signal into a second input current signal that is in-phase with the single-ended to-be-shifted voltage signal and that cooperates with the first input current signal to constitute a differential input current signal pair;

a mixing circuit for receiving a differential oscillatory voltage signal pair, and coupled to said first and second transconductance modules for receiving the differential input current signal pair therefrom, said mixing circuit mixing the differential input current signal pair with the differential oscillatory voltage signal pair to generate a differential mixed voltage signal pair; and a single-ended to differential converting circuit coupled to said mixing circuit, for receiving a single-ended oscillatory voltage signal, and converting the single-ended oscillatory voltage signal into the differential oscillatory voltage signal pair for receipt by said mixing circuit.

12. The mixer of claim 11, wherein the differential oscillatory voltage signal pair includes a first oscillatory voltage signal and a second oscillatory voltage signal, and said single-ended to differential converting circuit includes a balun having an input terminal that is for receiving a voltage signal associated with the single-ended oscillatory voltage signal, a first output terminal that provides a voltage signal associated with the first oscillatory voltage signal, and a second output terminal that provides a voltage signal associated with the second oscillatory voltage signal.

13. The mixer of claim 12, wherein said balun includes a first transmission line, a second transmission line, a third transmission line and a fourth transmission line that are formed in a top metal layer of a semiconductor process;

said first and third transmission lines being configured as interwound semi-circular spirals;

said second and fourth transmission lines being configured as interwound semi-circular spirals;

said first transmission line having an outer terminal, and an inner terminal that serves as said input terminal of said balun;

said second transmission line having an outer terminal that is directly coupled to said outer terminal of said first transmission line;

said third transmission line having an outer terminal that serves as said first output terminal of said balun;

said fourth transmission line having an outer terminal that serves as said second output terminal of said balun.

14. A mixer comprising:

a transconductance circuit including
a first capacitor having a first terminal for receiving a single-ended to-be-shifted voltage signal, and a second terminal, a first transconductance module coupled to said first terminal of said first capacitor for receiving the single-ended to-be-shifted voltage signal thereat, and converting the single-ended to-be-shifted voltage signal into a first input current signal that is anti-phase with the single-ended to-be-shifted voltage signal, and a second transconductance module coupled to said second terminal of said first capacitor for receiving a voltage signal thereat, and converting the voltage signal into a second input current signal that is in-phase with the single-ended to-be-shifted voltage signal and that cooperates with the first input current signal to constitute a differential input current signal pair; and a mixing circuit for receiving a differential oscillatory voltage signal pair, and coupled to said first and second transconductance modules for receiving the differential input current signal pair therefrom, said mixing circuit mixing the differential input current signal pair with the differential oscillatory voltage signal pair to generate a differential mixed voltage signal pair;

wherein said second transconductance module includes a transistor having a first terminal, a second terminal, and a control terminal that is coupled to said second terminal of said first capacitor for receiving the voltage signal thereat, a first inductor having a first terminal that is coupled to said mixing circuit and that provides the second input current signal, and a second terminal that is coupled to said first terminal of said transistor, a second capacitor coupled to said first inductor in parallel, and a second inductor coupled between said second terminal of said transistor and ground.

* * * * *